United States Patent
Sugioka (10) Patent No.: US 10,014,345 B1
(45) Date of Patent: Jul. 3, 2018

(54) MAGNETIC MEMORY DEVICE WITH GRID-SHAPED COMMON SOURCE PLATE, SYSTEM, AND METHOD OF FABRICATION

(71) Applicant: Micron Technology, Inc., Boise, ID (US)

(72) Inventor: Shigeru Sugioka, Hiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/399,509

(22) Filed: Jan. 5, 2017

(51) Int. Cl.
| | |
|---|---|
| *H01L 27/22* | (2006.01) |
| *G11C 11/16* | (2006.01) |
| *H01L 23/528* | (2006.01) |
| *H01L 43/08* | (2006.01) |
| *H01L 43/02* | (2006.01) |
| *H01L 23/532* | (2006.01) |

(52) U.S. Cl.
CPC .......... *H01L 27/222* (2013.01); *G11C 11/161* (2013.01); *H01L 23/528* (2013.01);
(Continued)

(58) Field of Classification Search
CPC ... H01L 27/222; H01L 27/224; H01L 27/226; H01L 27/228; H01L 27/105; H01L 27/10; H01L 27/2436; H01L 27/11; H01L 27/2463; H01L 27/0203; H01L 27/108; H01L 27/10802; H01L 27/10882; H01L 23/528; H01L 23/53228; H01L 23/53257; H01L 23/532; H01L 23/5226; H01L 29/4236; H01L 45/04; H01L 45/06; H01L 45/1233; H01L 45/143; H01L 45/144; H01L 45/146; H01L 45/147; H01L 45/16; H01L 2924/0002; H01L 43/00–43/14; H01L 29/7841; H01L 45/1253;
(Continued)

(56) References Cited

U.S. PATENT DOCUMENTS 8,587,042 B2 * 11/2013 Kajiyama ........... H01L 27/0207
257/295
8,963,236 B2 * 2/2015 Song ..................... H01L 27/228
257/334
(Continued)

FOREIGN PATENT DOCUMENTS

JP 20073177954 A 12/2007

OTHER PUBLICATIONS

Zhao et al., Architecting a Common-Source-Line Array for Bipolar Non-Volatile Memory Devices, Design, Automation & Test in Europe Conference & Exhibition, Mar. 12-16, 2012, pp. 1451-1454.

*Primary Examiner* — Marc Armand
*Assistant Examiner* — Younes Boulghassoul
(74) *Attorney, Agent, or Firm* — TraskBritt (57) ABSTRACT

Magnetic memory devices include an array of magnetic memory cells including magnetic tunnel junction regions. The array of magnetic memory cells includes access lines extending in a column direction and data/sense lines extending in a row direction transverse to the column direction. A common source plate electrically couples magnetic memory cells of the array in both the column direction and the row direction. Electronic systems include such a magnetic memory device operably coupled to a processor, to which at least one input device and at least one output device is operably coupled. Methods of fabricating magnetic memory devices include forming such an array of magnetic memory cells including a common source plate.

19 Claims, 9 Drawing Sheets

(52) U.S. Cl.
CPC .. *H01L 23/53228* (2013.01); *H01L 23/53257* (2013.01); *H01L 43/02* (2013.01); *H01L 43/08* (2013.01)

(58) Field of Classification Search
CPC ............... H01L 27/22; H01L 27/11521; H01L 27/11568; G11C 19/08; G11C 14/0036; G11C 14/0081; G11C 11/161; G11C 11/02; G11C 11/15; G11C 11/16; G11C 11/155
USPC ..... 257/427, 295, 5, 421, E29.323, E27.104, 257/334, 528, 379, 296, 314, 315, 324; 365/158, 148, 171, 63, 66, 173, 51, 163
See application file for complete search history.

(56) References Cited

U.S. PATENT DOCUMENTS

| | | | |
|---|---|---|---|
| 2007/0279963 A1* | 12/2007 | Tsuchida | G11C 11/1655 365/148 |
| 2008/0203503 A1* | 8/2008 | Asao | H01L 27/228 257/421 |
| 2008/0239782 A1* | 10/2008 | Asao | G11C 5/025 365/63 |
| 2013/0250661 A1 | 9/2013 | Sandhu et al. | |
| 2013/0334630 A1 | 12/2013 | Kula et al. | |
| 2013/0334631 A1 | 12/2013 | Kinney et al. | |
| 2014/0070342 A1 | 3/2014 | Sandhu et al. | |
| 2014/0138609 A1 | 5/2014 | Satoh et al. | |
| 2014/0264663 A1 | 9/2014 | Chen et al. | |
| 2015/0001654 A1 | 1/2015 | Sandhu et al. | |
| 2015/0028439 A1 | 1/2015 | Kula et al. | |
| 2015/0076485 A1 | 3/2015 | Sandhu et al. | |
| 2015/0076633 A1 | 3/2015 | Siddik et al. | |
| 2015/0137291 A1 | 5/2015 | Kula et al. | |
| 2015/0214472 A1 | 7/2015 | Sandhu et al. | |
| 2015/0249202 A1 | 9/2015 | Siddik et al. | |
| 2015/0295164 A1 | 10/2015 | Sandhu et al. | |
| 2015/0303372 A1 | 10/2015 | Meade et al. | |
| 2016/0111632 A1 | 4/2016 | Sandhu et al. | |
| 2016/0155932 A1 | 6/2016 | Chen et al. | |
| 2016/0211440 A1 | 7/2016 | Siddik et al. | |

* cited by examiner

MAGNETIC MEMORY DEVICE WITH GRID-SHAPED COMMON SOURCE PLATE, SYSTEM, AND METHOD OF FABRICATION

TECHNICAL FIELD

Embodiments disclosed herein relate to magnetic memory devices and electronic systems including a magnetic memory device. More specifically, embodiments disclosed herein relate to semiconductor structures and magnetic cell array structures for magnetic memory devices (e.g., Magnetic Random Access Memory (MRAM) devices), to electronic systems including such magnetic memory devices, and to methods of forming such magnetic memory devices.

BACKGROUND

Figure 1:
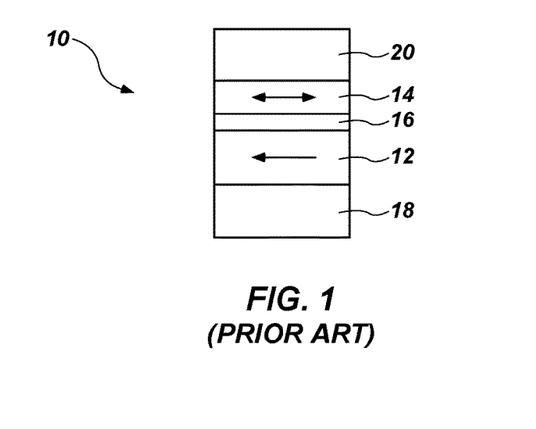
FIG. 1 is a simplified schematic side view of a known STT-MRAM cell.

MRAM is a non-volatile computer memory technology based on magnetoresistance. One type of MRAM cell is a spin torque transfer MRAM (STT-MRAM) cell, which includes a magnetic cell core supported by a substrate. As shown in FIG. 1, a known STT-MRAM cell 10 generally includes at least two magnetic regions, for example, a "fixed region" 12 (also known in the art as a "pinned region") and a "free region" 14, with a non-magnetic region 16 between the fixed region 12 and the free region 14. The fixed region 12, free region 14, and non-magnetic region 16 form a magnetic tunnel junction region (MTJ) of the STT-MRAM cell 10. The STT-MRAM cell 10 may also include a first electrode 18 electrically coupled to the fixed region 12 and a second electrode 20 electrically coupled to the free region 14. The fixed region 12 and the free region 14 may exhibit magnetic orientations that are either horizontally oriented ("in-plane") as shown in FIG. 1 by arrows, or perpendicularly oriented ("out-of-plane") relative to the width of the regions. The fixed region 12 includes a magnetic material that has a substantially fixed magnetic orientation (e.g., a non-switchable magnetic orientation during normal operation). The free region 14, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region 12 and the free region 14 are directed in opposite directions (e.g., north and south, east and west, south and north, or west and east, respectively). In the parallel configuration, the STT-MRAM cell 10 exhibits a lower electrical resistance across the magnetoresistive elements (e.g., the fixed region 12 and free region 14). This state of low electrical resistance may be defined as a "0" logic state of the STT-MRAM cell 10. In the anti-parallel configuration, the STT-MRAM cell 10 exhibits a higher electrical resistance across the magnetoresistive elements. This state of high electrical resistance may be defined as a "1" logic state of the STT-MRAM cell 10.

Switching of the magnetic orientation of the free region 14 may be accomplished by passing a programming current through the STT-MRAM cell 10 and the fixed region 12 and free region 14 therein. The fixed region 12 polarizes the electron spin of the programming current, and torque is created as the spin-polarized current passes through the cell 10. The spin-polarized electron current exerts torque on the free region 14. When the torque of the spin-polarized electron current passing through the cell 10 is greater than a critical switching current density ($J_c$) of the free region 14, the direction of the magnetic orientation of the free region 14 is switched. Thus, the programming current can be used to alter the electrical resistance across the magnetic fixed and free regions 12, 14. The resulting high or low electrical resistance states across the magnetoresistive elements enable the read and write operations of the STT-MRAM cell. After switching the magnetic orientation of the free region 14 to achieve the parallel configuration or the anti-parallel configuration associated with a desired logic state, the magnetic orientation of the free region 14 is usually desired to be maintained, during a "storage" stage, until the STT-MRAM cell 10 is to be rewritten to a different configuration (i.e., to a different logic state). Accordingly, the STT-MRAM cell 10 is non-volatile and holds its logic state even in the absence of applied power.

High density cell array layouts are desired to obtain STT-MRAM devices with high data storage capabilities. However, STT-MRAM conventionally requires higher current to read and/or write logic states compared to other non-volatile memory, such as NAND Flash memory. Several publications describe efforts to achieve high density cell array layout and/or to reduce the current required to read and/or write logic states in STT-MRAM devices. For example, U.S. Patent Application Publication No. 2007/0279963 to Kenji Tsuchida et al., filed Feb. 9, 2007, titled "Semiconductor Memory" (hereinafter "the '963 Publication") describes an STT-MRAM cell layout with a dual-access trench. The '963 Publication describes a conventional layout that achieves a cell size of $12F^2$, where F is a smallest feature size (e.g., width of a line, trench, or other feature). The '963 Publication describes staggering the cells to achieve a smaller $8F^2$ cell size. The article by Bo Zhao et al. titled "Architecting a Common-Source-Line Array for Bipolar Non-Volatile Memory Devices," published in the Proceedings of the Design, Automation & Test in Europe Conference & Exhibition held Mar. 12-16, 2012 (hereinafter "Zhao"), describes a source line that is parallel to a word line direction and that is used as a source for all cells along the source line. Zhao also describes a cell arrangement to achieve a $6F^2$ cell size.

DETAILED DESCRIPTION

The illustrations included herewith are not meant to be actual views of any particular systems or structures, but are merely idealized representations that are employed to describe embodiments of the present disclosure. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques and material types employed in the semiconductor industry. In addition, the description provided herein does not form a complete process flow for manufacturing semiconductor devices, magnetic cell array structures, or magnetic memory cells, and the semiconductor devices, magnetic cell array structures, and memory cells described below do not form a complete semiconductor device, magnetic cell structure, or magnetic memory cell. Only those process acts and structures necessary for one of ordinary skill in the art to understand the embodiments described herein are described in detail below. Additional acts to form a complete semiconductor device and a memory cell array may be performed by conventional techniques.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "overlying," "underlying," etc., is used for clarity and convenience in understanding the disclosure and accompanying drawings and does not connote or depend on any specific preference, orientation, or order, except where the context clearly indicates otherwise.

As used herein, the terms "vertical" and "horizontal" merely refer to a drawing figure as oriented on the drawing sheet, and in no way are limiting of orientation of a PCM device or any portion thereof.

As used herein, the term "forming" means and includes any method of creating, building, depositing, and/or patterning a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Material may be formed and/or patterned into various shapes and configurations using known techniques, such as isotropic etching, anisotropic etching, chemical-mechanical polishing (CMP), ablating, etc. Depending on the specific material to be formed, the technique for forming the material may be selected by a person of ordinary skill in the art.

According to some embodiments, a magnetic memory cell array structure may include a common source plate providing electrical access to the sources of all magnetic memory cells in the array. The common source plate may include linear portions that extend in two directions that are at a first angle to bit lines and at a second angle to word lines of the array. In other words, the common source plate may be characterized as a plate of conductive material having cutouts through which bit contacts for MTJs respectively extend. The MTJs of the magnetic memory cell array may be staggered, in that the MTJs of one column or row may be offset from MTJs of an immediately adjacent column or row. Thus, the common source plate may electrically connect to magnetic memory cells in two transverse directions (e.g., a row direction and a column direction). Magnetic memory (e.g., STT-MRAM) devices including the disclosed magnetic memory cell arrays with common source plates may exhibit improved (i.e., lower) electrical current requirements and may enable use of higher resistivity materials as source line material, compared to magnetic cell arrays with conventional linear source lines.

Figure 2A:
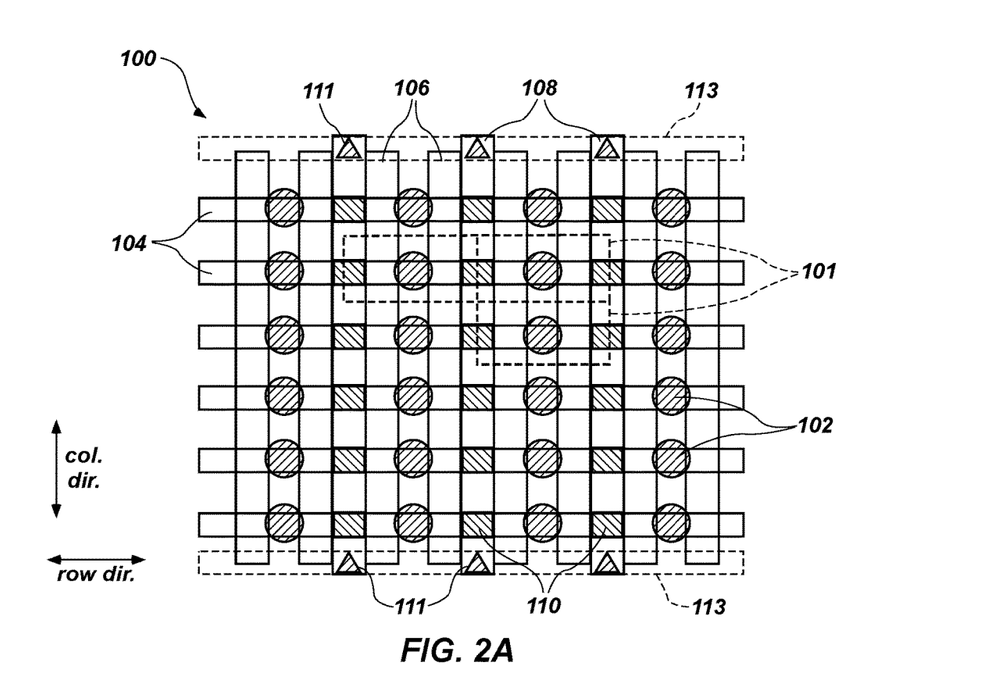
FIG. 2A is a simplified schematic top view of a linear array of STT-MRAM cells.
Figure 2B:
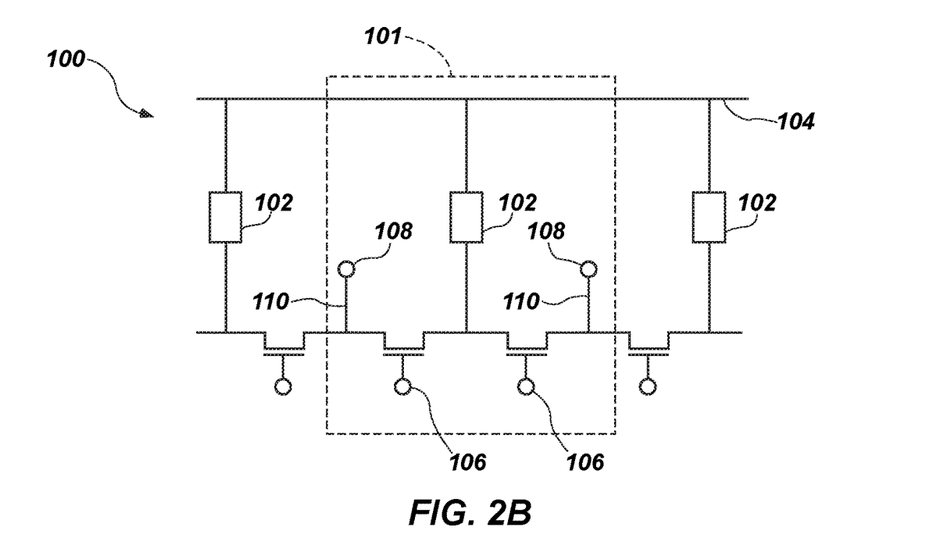
FIG. 2B is a cross sectional electrical circuit diagram taken along and through a bit line of the linear array of FIG. 2A.
Figure 2C:
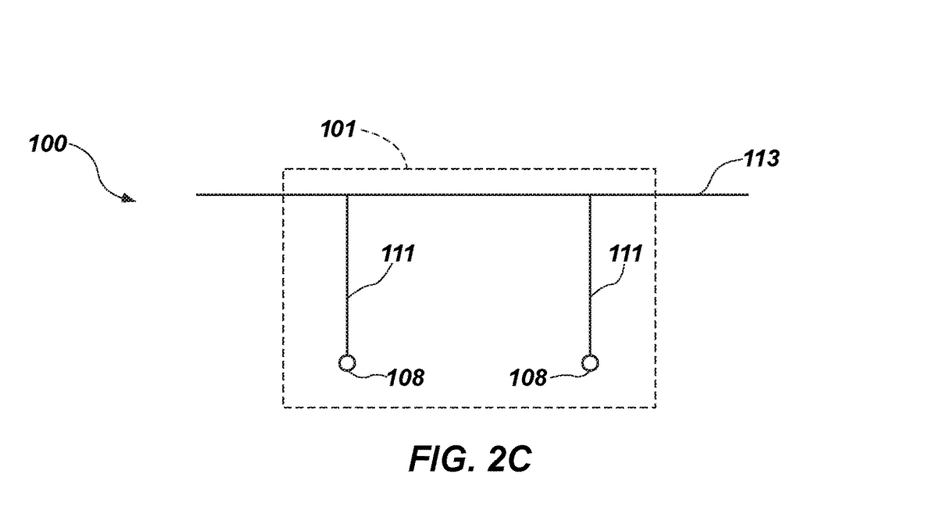
FIG. 2C is a schematic cross sectional diagram taken along and through a source power line of the linear array of FIG. 2A.

FIGS. 2A-2C and the accompanying description thereof in this specification are provided to enhance an understanding by one of ordinary skill in the art of embodiments of the present disclosure, and are not admitted by the applicant as prior art for any purpose.

FIG. 2A illustrates a linear array 100 of STT-MRAM cells 101 including MTJs 102 shown by shaded circles in FIG. 2A. FIG. 2B is a cross sectional electrical circuit diagram taken along and through a bit line 104 of the linear array 100 of FIG. 2A. FIG. 2C is a schematic cross sectional diagram taken along and through a source power line 113 of the linear array 100 of FIG. 2A. Certain elements shown in FIG. 2A are shown as transparent to more clearly illustrate structures that are overlying or underlying each other. The linear array 100 may include structures for operation of a device or system including the linear array 100 to electrically access and select, read from, write to, and/or erase data stored in the MTJs 102, such as data/sense lines (e.g., bit lines) 104, access lines (e.g., word lines) 1.06, source lines 108, source contacts 110 (shown as shaded boxes in FIG. 2A), source line power contacts 111 (shown as shaded triangles in FIG. 2A), source power lines 113 (shown in dashed lines in FIG. 2A), and as well as other contacts, conductive lines, active areas, isolation trenches, substrates, dielectric materials, and layers that are not shown in FIG. 2A for clarity but that are known to one of ordinary skill in the art. The MTJs 102 of the linear array 100 may be aligned in a column direction (e.g., vertically from the perspective of FIG. 2A) parallel to the word lines 106 and in a row direction (e.g., horizontally from the perspective of FIG. 2A) perpendicular to the column direction and parallel to the bit lines 104.

The bit lines 104 are electrically conductive materials that may extend along (e.g., over) and may be electrically coupled to MTJs 102 aligned in the row direction. The word lines 106 may be formed in access trenches formed in a semiconductor substrate underlying the MTJs 102 and may include an electrically conductive gate material and a gate dielectric material, forming an access transistor for each respective MTJ 102. The word lines 106 may extend along (e.g., under and parallel to) MTJs 102 aligned in the column direction. In the configuration shown in FIG. 2A, two word lines 106 may be operably coupled to each column of MTJs 102, such that the linear array 100 is a so-called "dual-channel" array of STT-MRAM cells 101.

The source lines 108 may also extend along (e.g., parallel to) MTJs 102 aligned in the column direction, such as between two adjacent columns of MTJs 102. The source contacts 110 may operably couple the source lines 108 to two word lines 106 of adjacent columns of MTJs 102. The source contacts 110 are not electrically coupled to the bit lines 104, other than the indirect connection through the word lines 106 and MTJs 102. Accordingly, the source lines 108 and source contacts 110 may be shared between two adjacent columns of MTJs 102. Source line power contacts 111 may be coupled to end portions of the source lines 108, which, in turn, may be coupled to one or more source power lines 113 for applying a voltage to the source lines 108.

In use and operation, when an STT-MRAM cell 101 including an MTJ 102 of the linear array 100 is selected to be programmed, a programming current is applied to the STT-MRAM cell 101, and the current is spin-polarized by the fixed region of the MTJ 102 and exerts a torque on the free region of the MTJ 102, which switches the magnetization of the free region to "write to" or "program" the MTJ 102. In a read operation of the STT-MRAM cell 101, a current is used to detect a resistance state of the MTJ 102.

To initiate programming of a particular STT-MRAM cell 101, peripheral read/write circuitry may generate a write current (i.e., a programming current) to the bit line 104 and the source line 108 operably coupled to the MTJ 102 of the particular STT-MRAM cell 101. The polarity of the voltage between the bit line 104 and the source line 108 determines the switch (or maintenance) in magnetic orientation of the free region in the MTJ 102. By changing the magnetic orientation of the free region with the spin polarity, the free region is magnetized according to the spin polarity of the programming current and the programmed logic state is written to the MTJ 102.

To read data from the MTJ 102, the peripheral read/write circuitry generates a read voltage to the bit line 104 and the source line 108 through the MTJ 102 and the word lines 106 operably coupled to the MTJ 102. The programmed state of the STT-MRAM cell 101 relates to the electrical resistance across the MTJ 102, which may be determined by a potential difference (i.e., voltage) between the bit line 104 and the source line 108. A high resistance across the MTJ 102 may be read as a logic state of "1," and a low resistance across the MTJ 102 may be read as a logic state of "0," for example.

Figure 3A:
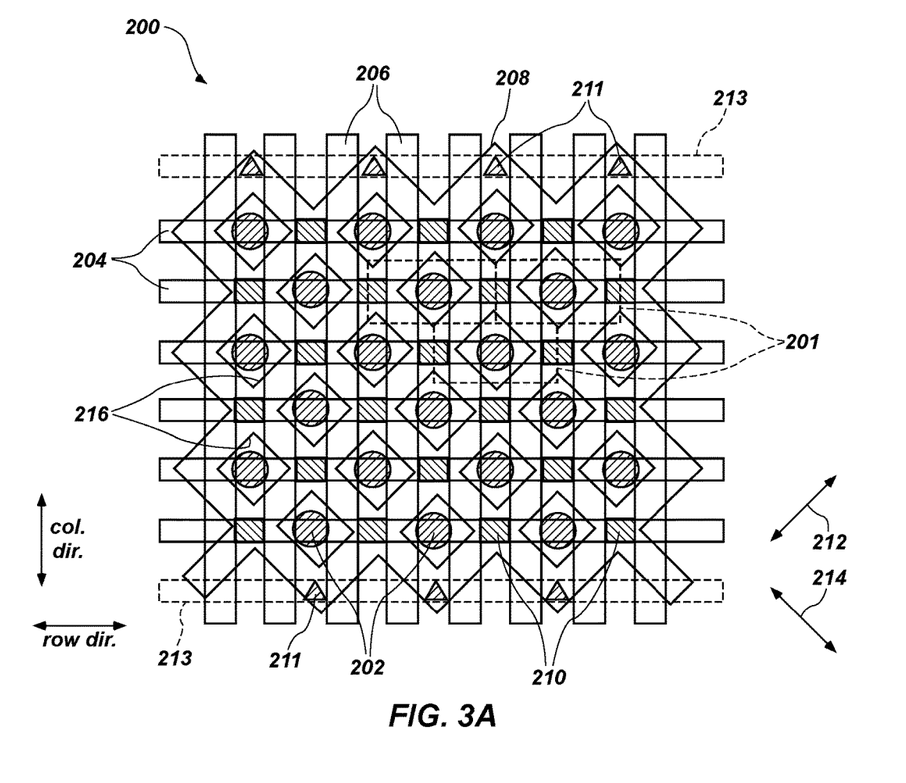
FIG. 3A is a simplified schematic top view of an array of magnetic cells according to an embodiment of the present disclosure.
Figure 3B:
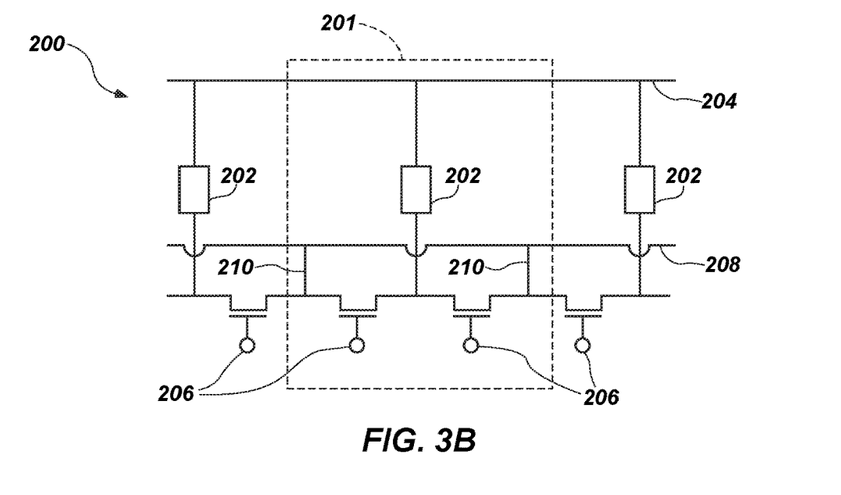
FIG. 3B is a cross sectional electrical circuit diagram taken along and through a bit line of the array of FIG. 3A.
Figure 3C:
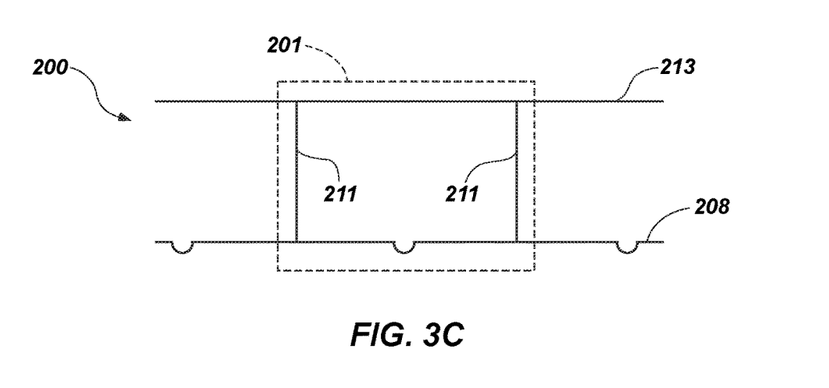
FIG. 3C is a schematic cross sectional diagram taken along and through a source power line of the array of FIG. 3A.

FIG. 3A illustrates an array 200 of magnetic memory cells 201 including MTJs 202 shown by shaded circles in FIG. 3A. FIG. 3B is a cross sectional electrical circuit diagram taken along and through a bit line 204 of the array 200 of FIG. 3A. FIG. 3C is a cross sectional electrical circuit diagram taken along and through a source power line 213 of the array 200 of FIG. 3A. Certain elements shown in FIG. 3A are shown as transparent to more clearly illustrate structures that are overlying or underlying each other. The array 200 may include structures for operation of a device or system including the array 200 to electrically access and select, read from, write to, and/or erase data stored in the MTJs 202, such as data/sense lines (e.g., bit lines) 204, access lines (e.g., word lines) 206, a common source plate 208, source contacts 210 (shown as shaded boxes in FIG. 3A), source contacts 211 (shown as shaded triangles in FIG. 3A), the source power lines 213 (shown in dashed lines in FIG. 3A), and as well as other contacts, conductive lines, active areas, isolation trenches, substrates, dielectric materials, and layers that are not shown in FIG. 3A for clarity but that are known to one of ordinary skill in the art. A column direction of the array 200 may be parallel to the word lines 206. A row direction of the array 200 may be perpendicular to the column direction and parallel to the bit lines 204.

The MTJs 202 in the array 200 may be staggered, such that MTJs 202 in one column are offset (i.e., not aligned in a row direction) from MTJs 202 in an immediately adjacent column. Similarly, MTJs 202 in one row are offset (i.e., not aligned in a column direction) from MTJs 202 in an immediately adjacent row. The MTJs 202 of the array 200 may be aligned in one or more directions at an angle to the column direction (i.e., a direction parallel to the word lines 206) and to the row direction (i.e., a direction parallel to the bit lines 204). By way of example and not limitation, the MTJs 202 may be aligned in a first angled direction 212 at an angle of between about 35 degrees and about 55 degrees, such as about 45 degrees, from the column direction and at a complementary angle from the row direction. The MTJs 202 may also be aligned in a second angled direction 214 at an angle of between about 35 degrees and about 55 degrees, such as about 45 degrees, from the row direction and at a complementary angle from the column direction. Each of the magnetic memory cells 201 of the array 200 may have a cell size of about $8F^2$. The feature size F may be the same in the column and row directions or may be different in the column and row directions.

The bit lines 204 are electrically conductive materials that may extend along (e.g., over) and may be electrically coupled to MTJs 202 aligned in the row direction, being MTJs 202 in every other column. The word lines 206 may be formed in access trenches formed in a semiconductor substrate underlying the MTJs 202 and may include an electrically conductive gate material and a gate dielectric material, forming an access transistor for each respective MTJ 202. The word lines 206 may extend along (e.g., under and parallel to) MTJs 202 aligned in the column direction, being MTJs 202 in every other column. Similar to the configuration described above in connection with FIG. 2A, two word lines 206 of the array 200 illustrated in FIG. 3A may be operably coupled to each column of MTJs 202, such that the array 200 is a dual-channel array of magnetic memory cells 201. The dual-channel arrangement, in comparison to a so-called "single-channel" arrangement in which a single word line is operably coupled to each column of cells, may result in an increase of gate width, and therefore current drivability, by connection of two selection transistors in parallel to each MTJ 202. Some conventional STT-MRAM memory cells with dual channels may have a cell size of about $12F^2$. However, the layout of the cells 201 of the present disclosure may result in a cell size of about $8F^2$. In operation, certain word lines 206 may be unselected by applying a negative voltage to the word lines 206.

The common source plate 208 may be electrically coupled to all of the magnetic memory cells 201 of all columns and rows of the array 200. The common source plate 208 may include linear portions that extend in the first direction 212 and linear portions that extend in the second direction 214, as illustrated in FIG. 3A. In other words, the common source plate 208 may be characterized as a plate of conductive material having cutouts 216 through which the staggered MTJs 202 respectively extend. The cutouts 216 may be generally rectangular as shown in FIG. 3A, or may have another shape, such as a trapezoid shape, a circle shape, or a parallelogram shape, for example. Source line power contacts 211 may be coupled to end portions of the common source plate 208, which, in turn, may be coupled to one or more source power lines 213 for applying a voltage to the common source plate 208.

Figure 4A:
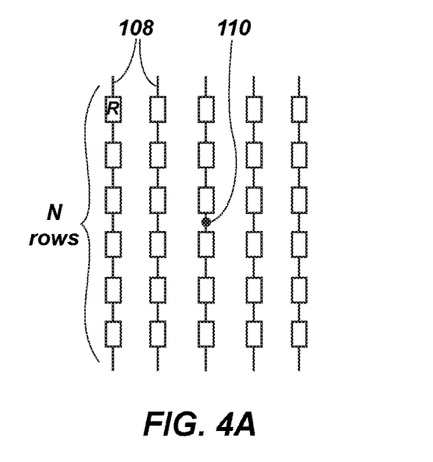
FIG. 4A shows a representation of a linear array of magnetic cells to illustrate resistive properties of the linear array.
Figure 4B:
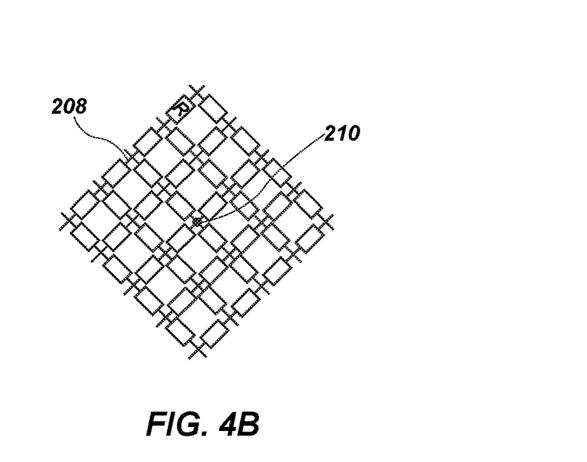
FIG. 4B shows a representation of an array of magnetic cells according to an embodiment of the present disclosure to illustrate resistive properties of the array.

FIG. 4A illustrates resistive properties of the source lines 108 of the linear array 100 shown in FIG. 2A and FIG. 4B illustrates resistive properties of the common source plate 208 shown in FIG. 3A. Contacts 111 (FIG. 2A) for applying voltage to the source lines 108 may be positioned at end portions of the source lines 108, such as at a top and bottom of the source line 108 as illustrated in FIG. 4A. Similarly, contacts 211 (FIG. 3A) for applying voltage to the common source plate 208 may be positioned at end portions of the common source plate 208. A maximum resistance of the common source plate 208 may be reduced compared to a maximum resistance of the source line 108. As shown in FIG. 4A, a maximum resistance of each source line 108 may be estimated by considering the source line 108 as a linear series of resistors (illustrated as rectangles) between each source contact 110. A maximum electrical resistance through the source line 108 at a source contact 110 in a column of N cells may be about R*N/2, where R is a resistance of a segment of the source line 108 between adjacent source contacts 110.

As shown in FIG. 4B, a maximum resistance of the common source plate 208 may be estimated by computer simulation by considering the common source plate 208 as a two-dimensional grid of resistors (illustrated as rectangles) with a source contact 210 at each grid intersection between the resistors. A maximum electrical resistance through the common source plate 208 at a source contact 210 in a column of N cells may be estimated as about R, where R is a resistance of a segment of the common source plate 208 between adjacent source contacts 210. Thus, where the number N of cells in a column is greater than 2, the common source plate 208 may exhibit a significantly reduced resistance compared to linear source lines 108. The reduced resistance of the common source plate 208 may enable a reduced current to be applied to a source of each magnetic memory cell 201.

In addition, since the resistance of the common source plate 208 to access any given cell 201 in the array 200 is not significantly dependent on the number of cells in the array 200, a nominal resistance of a material selected for the common source plate 208 is less significant than in materials selected for the linear source lines 108 of the linear array 100. Accordingly, conductive materials having relatively higher resistance may be selected for the common source plate 208 compared to materials selected for linear source lines 108.

By way of example and not limitation, a copper source line 108 or common source plate 208 may have a resistance of about 2.45-3.93Ω per cell 101, 201 assuming a line width of between about 21 nm and about 23 nm and a line height of about 55 nm. A tungsten source line 108 may have a resistance of about 13.38-17.47Ω per cell 101 assuming a line width of between about 21 nm and about 23 nm and a line height of about 30 nm. A tungsten common source plate 208 may have a resistance of about 18.93-21.47Ω per cell 201 assuming a line width of between about 21 nm and about 23 nm and a line height of about 30 nm. Based on these assumptions, an estimated maximum resistance through the source line 108 or through the common source plate 208 is identified in Table 1 below. The minimum line width of the common source plate 208 is a minimum width thereof between adjacent cells 201.

TABLE 1

| Source Type | Material and Line Height | Minimum Line Width | Maximum Resistance (Ω) for 128 Bits Per Column | Maximum Resistance (Ω) for 256 Bits Per Column | Maximum Resistance (Ω) for 512 Bits Per Column | Maximum Resistance (Ω) for 1,024 Bits Per Column |
|---|---|---|---|---|---|---|
| Source Line 108 | Copper, 55 nm line height | 23 nm | 160 | 310 | 630 | 1260 |
| | | 22 nm | 180 | 350 | 700 | 1400 |
| | | 21 nm | 210 | 410 | 820 | 1640 |
| | Tungsten, 30 nm line height | 23 nm | 860 | 1710 | 3430 | 6850 |
| | | 22 nm | 950 | 1910 | 3810 | 7620 |
| | | 21 nm | 1120 | 2240 | 4470 | 8940 |
| Common Source Plate 208 | Copper, 55 nm line height | 23 nm | 3.5 | 3.5 | 3.5 | 3.5 |
| | | 22 nm | 3.6 | 3.6 | 3.6 | 3.6 |
| | | 21 nm | 3.9 | 3.9 | 3.9 | 3.9 |
| | Tungsten, 30 nm line height | 23 nm | 13.4 | 13.4 | 13.4 | 13.4 |
| | | 22 nm | 14.9 | 14.9 | 14.9 | 14.9 |
| | | 21 nm | 17.5 | 17.5 | 17.5 | 17.5 |

By way of example, an acceptable maximum external resistance value for dual-channel arrangements may be about 1000Ω or less to achieve sufficient current for writing data to the cells 101, 201, such as when a diameter of the MTJs 102, 202 is about 20-30 nm and the MTJs 102, 202 have a magnetic field oriented perpendicular to a substrate. Accordingly, tungsten may not be a viable option for the source lines 108 having 256 to 512 bits (e.g., cells) per column in the array 100 illustrated in FIG. 2A. Tungsten may only be available for higher line widths and lower bits per column, such as at least about 22 nm line width and 128 bits or less per column, since smaller line widths and/or higher bits per column made from tungsten exhibit maximum resistance values more than 1000Ω. Moreover, source lines 108 may not be feasible with 1,024 bits per column regardless of whether copper or tungsten is selected for the source lines 108 since the maximum resistance is greater than 1000Ω using either material.

On the other hand, when an array 200 having a common source plate 208 (FIG. 3A) is used, rather than a linear array 100 having source lines 108 (FIG. 2A) as described above, resistance values may be well below the 1000Ω threshold (e.g., about 20Ω or less) for all line widths between about 21 nm and about 23 nm and for all quantities between 128 and 1,024 bits per column using either copper or tungsten for the common source plate 208. Thus, the common source plate 208 configuration enables the use of different materials (e.g., materials having higher nominal resistance), arrays 200 having a higher number of bits (e.g., cells) per column, and/or source lines having a smaller line width and/or height. Tungsten may have advantages over copper when employed as a source material in manufacturability, reduction of impurities and contamination of adjacent features, smaller line height, and cost, for example.

Although copper and tungsten are analyzed and discussed above as a comparative example and to show certain advantages of the common source plate configuration, additional conductive materials may also be used as a material for the common source plate 208. For example, copper, tungsten, titanium, tantalum, aluminum, silver, gold, conductive silicides thereof, conductive nitrides thereof, or combinations thereof may be selected and used for the common source plate 208.

Figure 5:
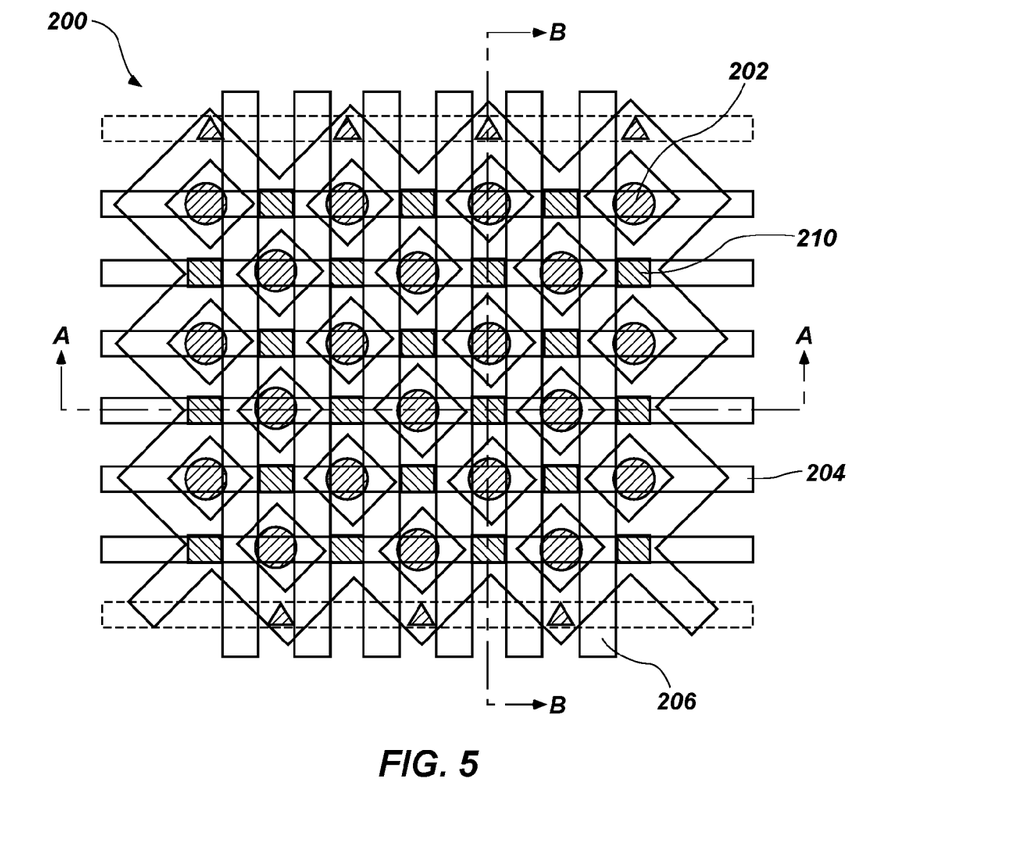
FIG. 5 is a simplified schematic top view of the array of magnetic cells according to the embodiment of FIG. 3A.

FIG. 5 illustrates the array 200 of FIG. 3A, with section lines A-A and B-B identified. The section line A-A extends through a row of MTJs 202 and source contacts 210 and along a bit line 204. The section line B-B extends through a column of MTJs 202 and source contacts 210 and parallel to word lines 206.

Figures 6A, 6B, 6C:
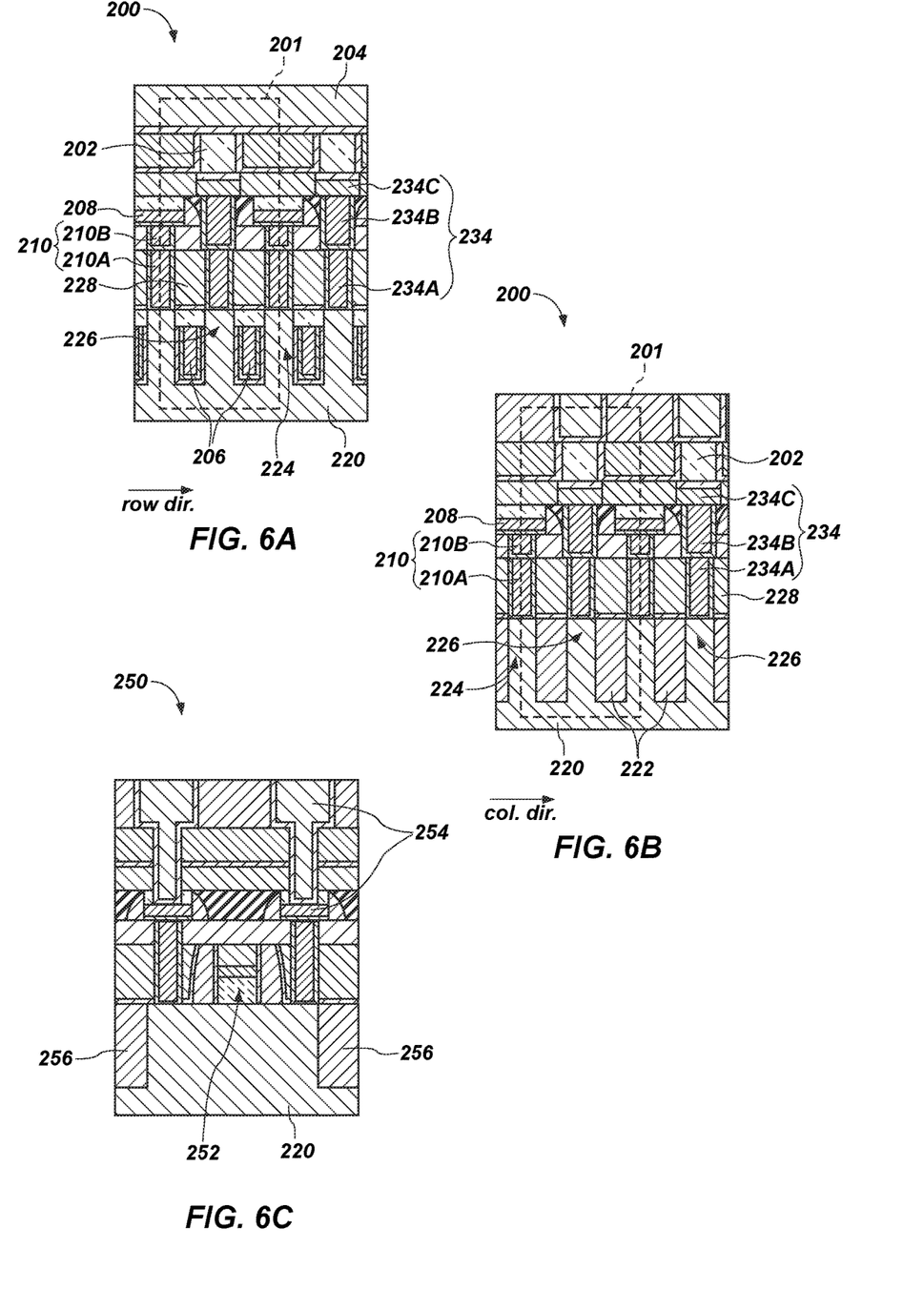
FIG. 6A shows a cross-sectional view of the array of magnetic cells taken from line A-A of FIG. 5.
FIG. 6B shows a cross-sectional view of the array of magnetic cells taken from line B-B of FIG. 5.
FIG. 6C shows a cross-sectional view of a peripheral region of a semiconductor device including the array of magnetic cells.

FIGS. 6A-6C illustrate cross-sectional views of the array 200 of FIG. 5. FIG. 6A shows a cross-sectional view of the array 200 through section line A-A of FIG. 5. FIG. 6B shows a cross-sectional view of the array 200 through section line B-B of FIG. 5. FIG. 6C shows a cross-sectional view of a peripheral portion 250 of a memory device including the array 200.

Referring to FIGS. 6A and 6B, the word lines 206 may be formed on or in a semiconductor substrate 220. The semiconductor substrate 220 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in this description, previous process stages may have been utilized to form material, regions, or junctions in the base semiconductor structure or foundation.

By way of example and not limitation, the word lines 206 may be formed of one or more conductive materials, such as a tungsten material at least partially surrounded by a titanium nitride material. Portions (e.g., lower portions) of the word lines 206 may be electrically isolated from the surrounding semiconductor substrate 220 by a dielectric material, such as a silicon dioxide material. An upper portion of the word lines 206 may include, for example, a conductive metal silicide material, such as tungsten silicide. A dielectric gate material may be positioned over the word lines 206. The word lines 206 may extend in the column direction (i.e., into-and-out of the page when viewed in the perspective of FIG. 6A, left-and-right when viewed in the perspective of FIG. 6B), with two word lines 206 present in each magnetic memory cell 201. Shallow trench isolation (STI) regions 222 of a dielectric material may be positioned in the semiconductor substrate 220 to electrically isolate adjacent magnetic memory cells 201 from each other. Portions of the semiconductor substrate 220 between the word lines 206 of adjacent cells 201 may define a semiconductor source region 224. Portions of the semiconductor substrate 220 between the word lines 206 of a single cell 201 may define a semiconductor drain region 226. In certain operations (e.g., writing data from a "1" state to a "0" state), the semiconductor source region 224 may act as a drain, while the semiconductor drain region 226 may act as a source. Accordingly, the nomenclature for the semiconductor source region 224 and the semiconductor drain region 226 is used for convenience and clarity in understanding this disclosure, but it is to be understood that the functions thereof may be switched during certain operations.

One or more dielectric materials 228 may be positioned over the semiconductor substrate 220 and word lines 206. Conductive source contacts 210 (including lower source contact portions 210A and upper source contact portions 210B) and conductive cell contacts 234 may extend from the semiconductor substrate 220 through the one or more dielectric materials 228. The common source plate 208 may be positioned over and electrically coupled to the source contacts 210. As discussed above, the common source plate 208 may be configured as a grid of conductive material that is operably coupled to adjacent cells 201 in both the row direction and the column direction. A conductive cell contact 234 (including lower cell contact portion 234A, upper cell contact portion 234B, and MTJ lower electrode material 234C) may be positioned over and electrically coupled to each of the cell contacts 234. The cell contact 234 may include one or more conductive materials. By way of non-limiting example, the lower cell contact portion 234A and the upper cell contact portion 234B may each include a tungsten material at least partially surrounded by a titanium nitride material. The MTJ lower electrode material 234C may include a titanium nitride material and a tantalum material over the titanium nitride material. In some embodiments, other conductive materials may be used for the cell contact 234, as selected by one of ordinary skill in the art.

The MTJs 202 may be respectively positioned over and may be electrically coupled to the cell contacts 234. The MTJs 202 may include a fixed magnetic region and a switchable magnetic region separated by a non-magnetic region, as discussed above. The fixed and switchable magnetic regions may have a magnetic orientation that is substantially parallel to the semiconductor substrate 220 (i.e., horizontally from the perspective of FIGS. 6A and 6B) or, alternatively, may have a magnetic orientation that is substantially perpendicular to the semiconductor substrate 220 (e.g., vertically from the perspective of FIGS. 6A and 6B).

The bit lines 204 may be positioned over and electrically coupled to the MTJs 202. The bit lines 204 may extend in the row direction. The bit lines 204 may include one or more conductive materials, such as copper, tungsten, titanium, tantalum, conductive nitrides thereof, conductive silicides thereof, or combinations thereof, for example.

Referring to FIG. 6C, the peripheral portion 250 of a device including the array 200 of magnetic memory cells 201 (FIGS. 6A and 6B) may include, for example, read/write circuitry, a bit line reference, and an amplifier on or over the semiconductor substrate 220. The read/write circuitry may include access transistors 252 and peripheral conductive lines 254. Peripheral isolation trenches 256 filled with a dielectric material (e.g., silicon dioxide) may be positioned in the semiconductor substrate 220 to electrically isolate adjacent access transistors 252.

By way of example and not limitation, the peripheral conductive lines 254 may include copper, tungsten, or a combination of copper and tungsten. In some embodiments, an upper portion of the peripheral conductive lines 254 may include copper and a lower portion of the peripheral conductive lines 254 may include tungsten. In some embodiments, both the upper portion and the lower portion of the peripheral conductive lines 254 may include copper, or both the upper portion and the lower portion may include tungsten. The peripheral conductive lines 254 may operably connect the access transistors 252 of the peripheral portion 250 to the magnetic memory cells 201 (FIGS. 6A and 6B) of the array 200.

Accordingly, a magnetic memory device is disclosed that includes an array of magnetic memory cells. Each of the magnetic memory cells of the array may include a semiconductor substrate, at least one access line extending in a column direction in or on the semiconductor substrate, and a bit contact operably coupled to the at least one access line on a drain side of the at least one access line. A magnetic tunnel junction region may be electrically coupled to the bit contact. At least one data/sense line may be electrically coupled to the magnetic tunnel junction region and may extend in a row direction transverse to the column direction. At least one source contact may be operably coupled to the at least one access line on a source side of the at least one access line. A common source plate may be electrically coupled to the at least one source contact. The common source plate may electrically couple the at least one source contact of each of the magnetic memory cells of the array to the at least one source contact of adjacent magnetic memory cells of the array in both the column direction and the row direction.

Figure 7:
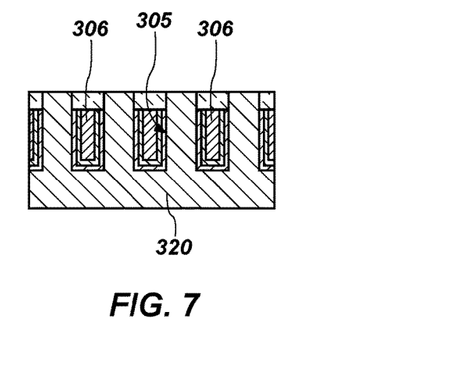
FIGS. 7 through 14 show a method of forming an array of magnetic memory cells according to an embodiment of the present disclosure.

FIGS. 7 through 14 show a method of forming an array 300 of magnetic memory cells 301 according to an embodiment of the present disclosure. Referring to FIG. 7, a semiconductor substrate 320 may be provided. Dielectric STI regions and access line trenches 305 may be formed in the semiconductor substrate 320. The access line trenches 305 may be at least partially filled with one or more conductive materials to form access lines 306 (e.g., word lines). For example, the access line trenches 305 may be lined with a conformal dielectric material (e.g., silicon dioxide) and an outer conductive material, such as titanium nitride, may be conformally formed over inner surfaces of the dielectric material within the access line trenches 305. The remaining portion of the access line trenches 305 may be filled with an inner conductive material, such as tungsten. An upper portion of the conductive material within the access line trenches 305 may be converted to a metal silicide material, such as tungsten silicide, by diffusing silicon into the conductive material, to form the word lines 306.

Figure 8:
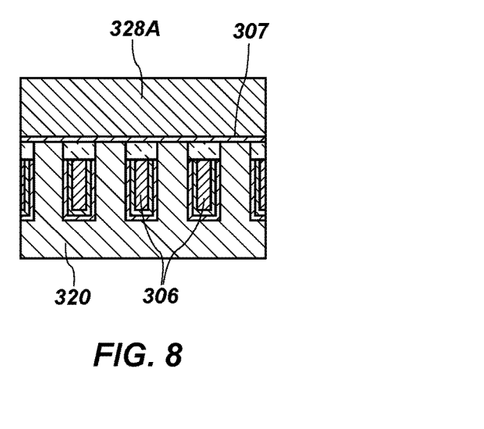

Referring to FIG. 8, a gate dielectric material 307 and a first interlayer dielectric material 328A may be formed over the semiconductor substrate 320 and word lines 306. For example, the gate dielectric material 307 may be a silicon dioxide material. The first interlayer dielectric material 328A may be one or more dielectric materials such as oxides (e.g., silicon dioxide) and/or nitrides (e.g., silicon nitride).

Figure 9:
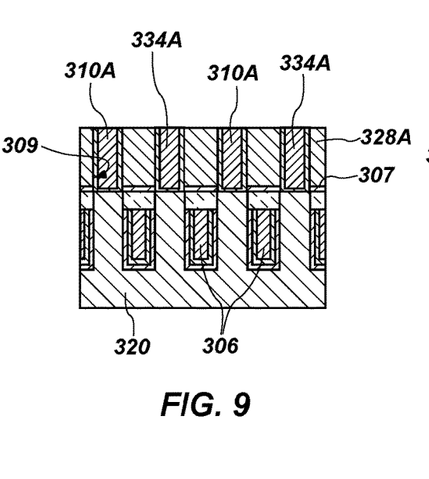

Referring to FIG. 9, holes 309 may be formed through the first interlayer dielectric material 328A and gate dielectric material 307 between adjacent word lines 306, to expose the semiconductor substrate 320. The holes 309 may be filled with one or more conductive materials to form lower source contact portions 310A and lower bit contact portions 334A. The one or more conductive materials may include, for example, an outer conformal layer of titanium nitride and an inner tungsten material. Excess conductive materials, if any, may be removed from over the first interlayer dielectric material 328A, such as by a chemical-mechanical polishing ("CMP") process.

Figure 10:
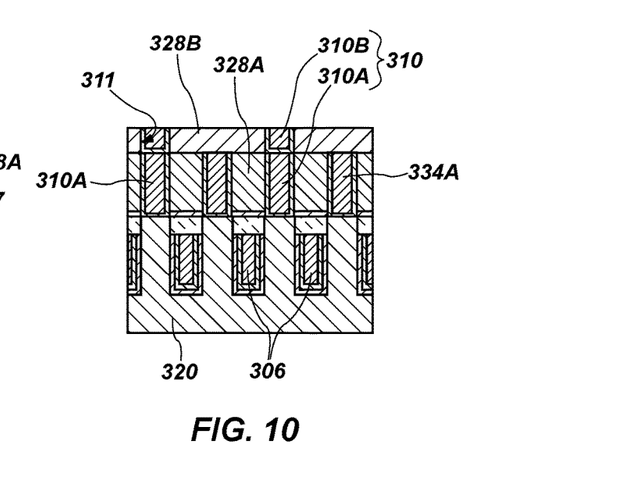

Referring to FIG. 10, a second interlayer dielectric material 328B may be formed over the first interlayer dielectric material 328A, lower source contact portions 310A, and lower bit contact portions 334A. Source contact holes 311 may be formed through the second interlayer dielectric material 328B and over the lower source contact portions 310A to expose the lower source contact portions 310A. One or more conductive materials may be formed in the source contact holes 311 to form upper source contact portions 310B. For example, an outer conformal layer of titanium nitride and an inner tungsten material may be used to form the upper source contact portions 310B. Excess conductive materials, if any, may be removed from over the second interlayer dielectric material 328B, such as by a CMP process. The lower and upper source contact portions 310A, 310B may define source contacts 310.

Figure 11:
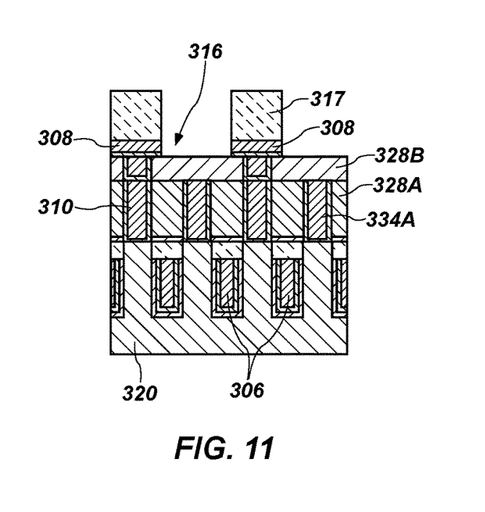

Referring to FIG. 11, a common source plate 308 may be formed over and in contact with the source contacts 310, and over the second interlayer dielectric material 328A. The common source plate 308 may be patterned to result in a structure similar to the common source plate 208 described above with reference to FIG. 3A. Accordingly, cutouts 316 may be formed over the lower bit contact portions 334A, but the common source plate 308 may operably connect adjacent source contacts 310 to each other in both column and row directions. The common source plate 308 may include a conductive material, such as copper, tungsten, titanium, tantalum, aluminum, gold, conductive silicides thereof, conductive nitrides thereof, or combinations thereof. A dielectric mask material 317 may be formed over the conductive material of the common source plate 308 and may be used for patterning the common source plate 308.

Figure 12:
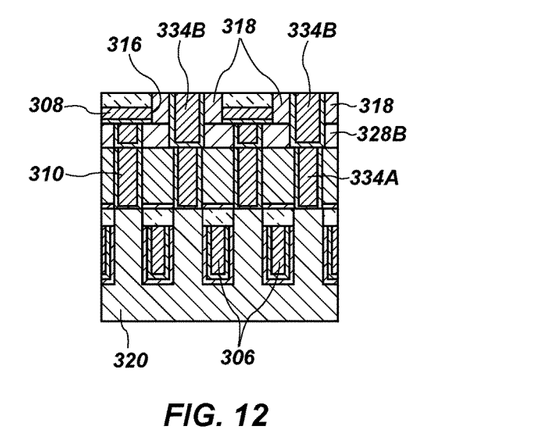

Referring to FIG. 12, upper bit contact portions 334B may be formed over the lower bit contact portions 334A and through the cutouts 316 in the common source plate 308. The upper bit contact portions 334B may be formed using a so-called "self-alignment contact" process, as follows. A dielectric spacer material 318, such as a silicon nitride material, may be formed over the dielectric mask material 317 and/or the common source plate 308. Portions of the dielectric spacer material 318 may be removed from horizontal surfaces, such as by using an anisotropic etch process, while other portions of the dielectric spacer material 318 may remain over vertical surfaces, such as along inner side walls of the cutouts 316. A sacrificial dielectric material, such as silicon dioxide, having different etch properties than the dielectric spacer material 318 may be formed over the structure. A top surface of the structure may be planarized, such as by a CMP process. Remaining portions of the sacrificial dielectric material (e.g., portions within the cutouts 316 and between the remaining dielectric spacer materials) may be removed, as well as an underlying portion of the second interlayer dielectric material 328B. This removal process may expose the lower bit contact portions 334A through the cutouts 316. One or more conductive materials may be formed in the cutouts 316 and in contact with the lower bit contact portions 334A to form upper bit contact portions 334B, which may extend through the second interlayer dielectric material 328B and through the cutouts 316 in the common source plate 308 between the dielectric spacer materials 318. The one or more conductive materials may be, for example, an outer layer of titanium nitride and an inner portion of tungsten. Excess conductive materials, if any, may be removed from over the structure, such as by a CMP process, to result in a structure like that shown in FIG. 12.

The process described with reference to FIGS. 10 through 12 is a process in which the common source plate 308 is formed prior to the upper bit contact portions 334B. However, the disclosure is not so limited. Rather, the disclosure also includes processes in which the upper bit contact portions 334B are formed over the lower bit contact portions 334A, after which the upper source contact portions 310B and the common source plate 308 are formed and operably coupled to the lower source contact portions 310A. Given the processes described above, one of ordinary skill in the art is capable of forming the upper bit contact portions 334B prior to the common source plate 308, as desired.

Figure 13:
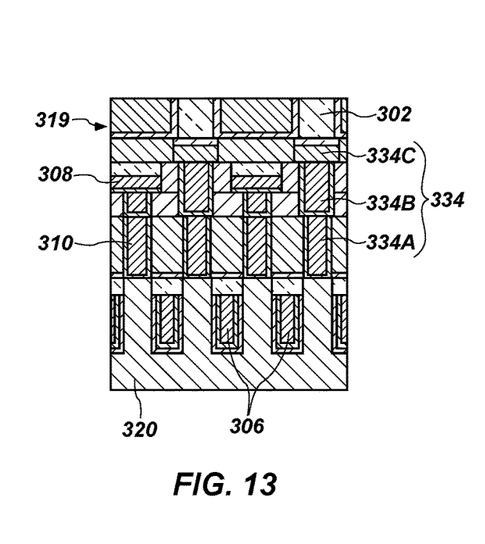

Referring to FIG. 13, an MTJ lower electrode material 334C may be formed over the upper bit contact portion 334B, for improved adhesion and electrical properties of the MTJs 302 to be formed thereover. The MTJ lower electrode material 334C may include one or more conductive materials, such as a titanium nitride material formed over and in contact with the upper bit contact portion 334B, and a tantalum material formed over and in contact with the titanium nitride material. However, one of ordinary skill in the art is capable of selecting the appropriate material(s) for the MTJ lower electrode material 334C considering the material and electrical properties of the MTJs 302. The MTJs 302 may be formed over and in contact with the MTJ lower electrode material 334C. The MTJs 302 may be formed as known in the art, such as to have the structure shown in FIG. 1. However, other MTJs 302 are known and capable of implementation with embodiments of this disclosure, as known by one of ordinary skill in the art. The MTJ lower electrode material 334C and MTJs 302 may be formed in and through an upper interlayer dielectric material 319, which may include one or more dielectric materials (e.g., silicon dioxide and silicon nitride). The lower bit contact portions 334A, upper bit contact portions 334B, and MTJ lower electrode materials 334C may together define bit contacts 334.

Figure 14:
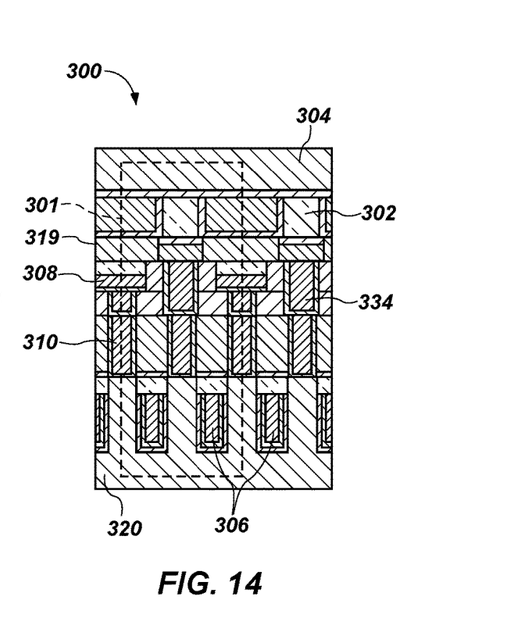

Referring to FIG. 14, data/sense lines 304 (e.g., bit lines) may be formed over the MTJs 302. MTJs 302 that are aligned in a row direction may be electrically coupled to the same bit line 304. The bit lines 304 may include one or more conductive materials, such as copper, tungsten, titanium, tantalum, aluminum, gold, conductive silicides thereof, conductive nitrides thereof, or combinations thereof. Each magnetic memory cell 301 of the array 300 may include an MTJ 302, a bit contact 334, at least one word line 306 (e.g., two word lines 306), at least one source contact 310, and a portion of the common source plate 308. The array 300 may, in plan view, have a similar configuration as the array 200 shown in FIG. 3A, for example.

Accordingly, the present disclosure includes methods of fabricating magnetic memory devices. In accordance with such methods, an array of magnetic memory cells may be formed. Each of the magnetic memory cells of the array may be formed by forming at least one access line extending in a column direction in or on a semiconductor substrate. A bit contact may be formed and operably coupled to the at least one access line on a drain side of the at least one access line. A magnetic tunnel junction region may be formed and electrically coupled to the bit contact. At least one data/sense line may be formed and electrically coupled to the magnetic tunnel junction region and may extend in a row direction transverse to the column direction. At least one source contact may be formed and operably coupled to the at least one access line on a source side of the at least one access line. A common source plate may be formed and electrically coupled to the at least one source contact. The common source plate may be patterned to electrically couple the at least one source contact of adjacent magnetic memory cells of the array in both the column direction and the row direction.

Embodiments of the disclosure may be implemented in STT-MRAM devices as well as other magnetic memory devices. Indeed, one of ordinary skill in the art may implement embodiments of the disclosure in a number of different semiconductor devices, example embodiments of which have been described herein.

Figure 15:
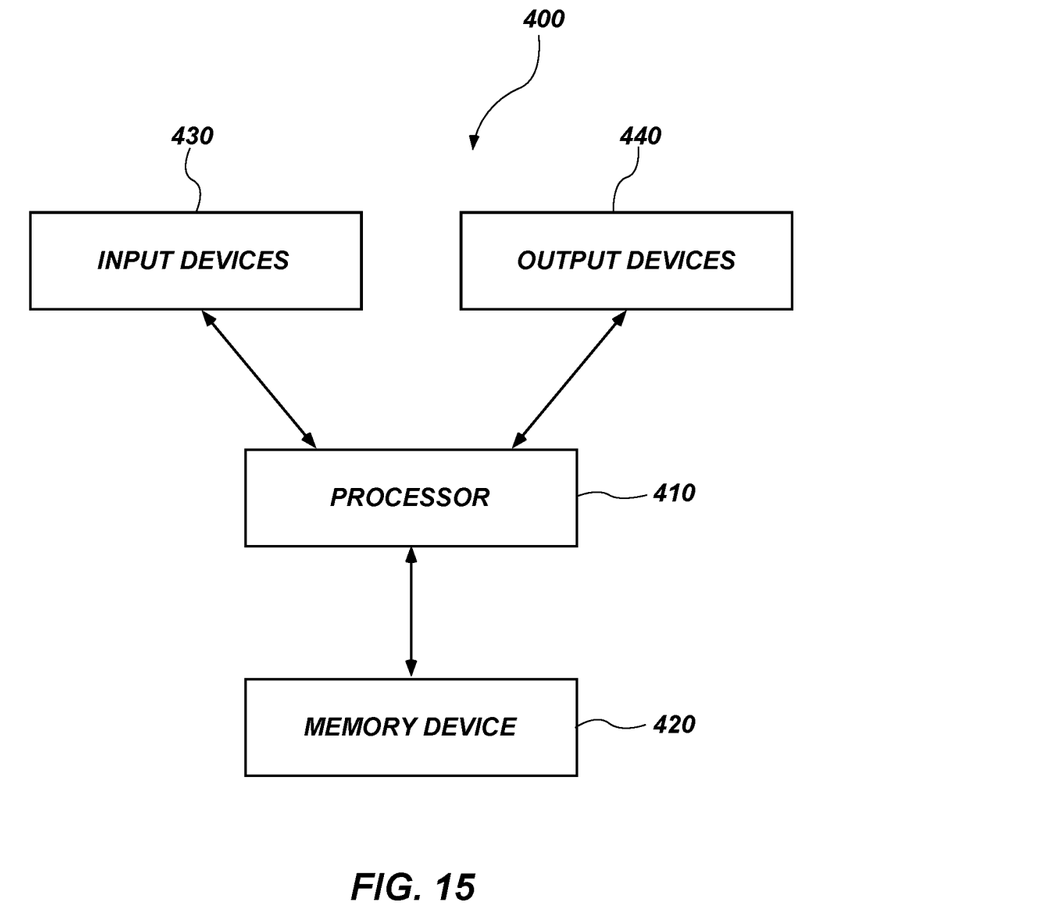
FIG. 15 shows a schematic block diagram of an electronic system according to an embodiment of the present disclosure.

FIG. 15 is a schematic block diagram of an electronic system 400 according to an embodiment of the present disclosure. The electronic system 400 includes a processor 410 operably coupled with a memory device 420, one or more input devices 430, and one or more output devices 440. The electronic system 400 may be a consumer electronic device, such as a desktop computer, a laptop computer, a tablet computer, an electronic reader, a smart phone, or other type of communication device, as well as any type of computing system incorporating non-volatile storage. The memory device 420 may be or include a magnetic memory device (e.g., one or more of the magnetic memory devices 200, 300) that includes a common source plate (e.g., one or more of the common source plates 208, 308) as discussed above.

Accordingly, the present disclosure includes electronic systems that include a magnetic memory device. The electronic systems may include at least one processor, at least one input device and at least one output device operably coupled to the at least one processor, and at least one magnetic memory device operably coupled to the at least one processor. The magnetic memory device may include an array of magnetic memory cells including conductive word lines in or on a semiconductor substrate, conductive bit lines, and magnetic tunnel junction regions each operably coupled to and between one of the conductive bit lines and, through a conductive bit contact, two of the conductive word lines. The conductive word lines may extend in a column direction and the conductive bit lines may extend in a row direction transverse to the column direction. A common source plate may be operably coupled to each of the conductive word lines through a conductive source contact and to each of the magnetic memory cells of the array.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

The invention claimed is:
1. A magnetic memory device, comprising:
an array of magnetic memory cells, each of the magnetic memory cells of the array comprising:
a semiconductor substrate;
at least one access line extending in a column direction in or on the semiconductor substrate;

a bit contact operably coupled to the at least one access line on a drain side of the at least one access line;

a magnetic tunnel junction region electrically coupled to the bit contact;

at least one data/sense line electrically coupled to the magnetic tunnel junction region and extending in a row direction transverse to the column direction;

at least one source contact operably coupled to the at least one access line on a source side of the at least one access line; and a common source plate electrically coupled to the at least one source contact, wherein the common source plate comprises first linear portions extending at a first acute angle to the row direction and second linear portions extending at a second acute angle to the column direction, wherein the first linear portions and the second linear portions intersect each other in a grid pattern at intersecting regions, wherein the at least one source contact is electrically coupled to the common source plate at at least one of the intersecting regions, and wherein the common source plate electrically couples the at least one source contact of each of the magnetic memory cells of the array to the at least one source contact of adjacent magnetic memory cells of the array in both the column direction and the row direction.

2. The magnetic memory device of claim 1, wherein the magnetic tunnel junction region comprises:
a fixed magnetic region;
a switchable magnetic region; and
a non-magnetic region between the fixed magnetic region and the switchable magnetic region.

3. The magnetic memory device of claim 2, wherein the fixed magnetic region and the switchable magnetic region have magnetic orientations perpendicular to the semiconductor substrate.

4. The magnetic memory device of claim 1, wherein the magnetic memory cells of the array are staggered, such that a first row of aligned magnetic memory cells is offset from a second row of aligned magnetic memory cells immediately adjacent to the first row.

5. The magnetic memory device of claim 1, wherein the common source plate comprises a tungsten material.

6. The magnetic memory device of claim 1, wherein the at least one access line of each of the magnetic memory cells of the array comprises two access lines.

7. The magnetic memory device of claim 1, wherein the array of magnetic memory cells comprises at least 1,024 magnetic memory cells along each access line.

8. The magnetic memory device of claim 1, wherein a minimum width of the common source plate between adjacent magnetic tunnel junction regions of the array is about 23 nm or less.

9. An electronic system including a magnetic memory device, comprising:
at least one processor;
at least one input device and at least one output device operably coupled to the at least one processor;
at least one magnetic memory device operably coupled to the at least one processor, the at least one magnetic memory device comprising:
an array of magnetic memory cells comprising:
conductive word lines in or on a semiconductor substrate, the conductive word lines extending in a column direction;
conductive bit lines extending in a row direction transverse to the column direction;

magnetic tunnel junction regions each operably coupled to and between one of the conductive bit lines and, through a conductive bit contact, two of the conductive word lines; and a common source plate operably coupled to each of the conductive word lines through a conductive source contact and to each of the magnetic memory cells of the array, wherein the common source plate comprises first linear portions and second linear portions, wherein the first linear portions extend at a first acute angle from the conductive bit lines, wherein the second linear portions are transverse to the first linear portions and extend at a second acute angle from the conductive word lines, wherein the first linear portions and the second linear portions intersect each other in a grid pattern at intersecting regions, and wherein the conductive source contact is electrically coupled to the common source plate at one of the intersecting regions.

10. The electronic system of claim 9, wherein the first acute angle is between about 35 degrees and about 55 degrees, and the second acute angle is between about 35 degrees and about 55 degrees.

11. The electronic system of claim 9, wherein the common source plate comprises tungsten having an average thickness of about 30 nm or less.

12. The electronic system of claim 9, wherein a maximum resistance across the common source plate is about 20Ω or less.

13. The electronic system of claim 9, wherein the conductive word lines are positioned in trenches formed in the semiconductor substrate.

14. The electronic system of claim 9, wherein the conductive bit contacts comprise a magnetic tunnel junction region electrode including at least two conductive materials.

15. A method of fabricating a magnetic memory device, the method comprising:
forming an array of magnetic memory cells, forming each magnetic memory cell of the array comprising:
forming at least one access line extending in a column direction in or on a semiconductor substrate;
forming and operably coupling a bit contact to the at least one access line on a drain side of the at least one access line;
forming and electrically coupling a magnetic tunnel junction region to the bit contact;
forming and electrically coupling at least one data/sense line to the magnetic tunnel junction region, the at least one data/sense line extending in a row direction transverse to the column direction;
forming and operably coupling at least one source contact to the at least one access line on a source side of the at least one access line; and
forming and electrically coupling a common source plate to the at least one source contact; and
patterning the common source plate to include first linear portions and transverse second linear portions, the first linear portions extending at a first acute angle from the column direction and the second linear portions extending at a second acute angle from the row direction, to electrically couple the at least one source contact of adjacent magnetic memory cells of the array in both the column direction and the row direction, wherein the first linear portions and the second linear portions intersect each other in a grid pattern at intersecting regions, wherein the at least one source contact is electrically coupled to the common source plate at at least one of the intersecting regions.

16. The method of claim 15, wherein the common source plate is formed and patterned prior to the bit contacts of the array being formed and operably coupled to the at least one access line.

17. The method of claim 15, wherein forming the at least one access line extending in the column direction in or on the semiconductor substrate comprises:
  forming two trenches in the semiconductor substrate; and
  filling the two trenches with at least one conductive material to define two access lines associated with each magnetic memory cell of the array.

18. The method of claim 15, wherein patterning the common source plate comprises forming cutouts in the common source plate through which bit contacts of the array respectively extend.

19. The method of claim 15, wherein patterning the common source plate to include first linear portions and transverse second linear portions comprises forming the first linear portions to extend at the first acute angle of between about 35 degrees and about 55 degrees from the row direction and forming the second linear portions to extend at the second acute angle of between about 35 degrees and about 55 degrees from the column direction.

* * * * *

UNITED STATES PATENT AND TRADEMARK OFFICE
CERTIFICATE OF CORRECTION

PATENT NO.        : 10,014,345 B1
APPLICATION NO.   : 15/399509
DATED             : July 3, 2018
INVENTOR(S)       : Shigeru Sugioka Page 1 of 1

It is certified that error appears in the above-identified patent and that said Letters Patent is hereby corrected as shown below:

In the Specification
Column 4,  Line 50,   change "1.06, source lines" to --106, source lines--
Column 5,  Line 60,   change "more dearly illustrate"
                      to --more clearly illustrate--

Signed and Sealed this
Twenty-eighth Day of May, 2019

Andrei Iancu
*Director of the United States Patent and Trademark Office*